(12) United States Patent
Hong et al.

(10) Patent No.: US 10,811,489 B2
(45) Date of Patent: Oct. 20, 2020

(54) ORGANIC LIGHT-EMITTING DISPLAY DEVICE

(71) Applicant: Samsung Display Co., Ltd., Yongin-si (KR)

(72) Inventors: Sangmin Hong, Yongin-si (KR); Heeseong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/747,291

(22) Filed: Jan. 20, 2020

(65) Prior Publication Data

US 2020/0152726 A1    May 14, 2020

Related U.S. Application Data

(63) Continuation of application No. 15/801,287, filed on Nov. 1, 2017, now Pat. No. 10,541,294.

(30) Foreign Application Priority Data

May 23, 2017    (KR) .................. 10-2017-0063514

(51) Int. Cl.
   *H01L 27/32*    (2006.01)
   *H01L 51/52*    (2006.01)
   (Continued)

(52) U.S. Cl.
   CPC ........ *H01L 27/3276* (2013.01); *H01L 27/326* (2013.01); *H01L 27/3216* (2013.01);
   (Continued)

(58) Field of Classification Search
   CPC combination set(s) only.
   See application file for complete search history.

(56) References Cited

U.S. PATENT DOCUMENTS

| 8,008,859 B2 | 8/2011 | Yang |
| 8,698,395 B2 | 4/2014 | Im et al. |

(Continued)

FOREIGN PATENT DOCUMENTS

| JP | 2010-003880 | 1/2010 |
| KR | 10-2006-0059068 | 6/2006 |

(Continued)

OTHER PUBLICATIONS

Search Report dated Aug. 28, 2018, issued in European Patent Application No. 18155745.5.

(Continued)

*Primary Examiner* — Nduka E Ojeh
(74) *Attorney, Agent, or Firm* — H.C. Park & Associates, PLC

(57) ABSTRACT

An organic light-emitting display device including a plurality of pixels, each of which includes an organic light-emitting device including a pixel electrode, an organic emission layer, and an opposing electrode; a pixel defining layer covering an edge of the pixel electrode and being configured to define a light-emission region by having an opening which exposes a portion of the pixel electrode; and a reference line overlapping the pixel electrode with an insulating layer between the reference line and the pixel electrode and extending in a first direction. The reference line overlaps with a center point of the opening, and the opening is shifted to one side of the pixel electrode in a second direction perpendicular to the first direction.

9 Claims, 12 Drawing Sheets

(51) Int. Cl.
- *H01L 27/12* (2006.01)
- *G09G 3/3233* (2016.01)
- *H01L 51/00* (2006.01)
- *H01L 29/08* (2006.01)
- *H01L 35/24* (2006.01)

(52) U.S. Cl.
CPC ...... *H01L 27/3218* (2013.01); *H01L 27/3246* (2013.01); *H01L 27/3248* (2013.01); *H01L 27/3258* (2013.01); *H01L 27/3262* (2013.01); *H01L 27/3265* (2013.01); *H01L 51/5209* (2013.01); *G09G 3/3233* (2013.01); *G09G 2300/0819* (2013.01); *G09G 2300/0842* (2013.01); *G09G 2300/0861* (2013.01); *G09G 2310/0262* (2013.01); *G09G 2320/045* (2013.01); *H01L 27/124* (2013.01); *H01L 27/1248* (2013.01); *H01L 27/1255* (2013.01); *H01L 27/3283* (2013.01)

(56) References Cited

U.S. PATENT DOCUMENTS

| | | | |
|---|---|---|---|
| 2013/0002127 | A1 | 1/2013 | Jeong et al. |
| 2013/0214301 | A1* | 8/2013 | Yamada ............... H01L 33/08 257/88 |
| 2014/0292622 | A1* | 10/2014 | Lee ...................... G09G 3/3233 345/80 |
| 2015/0170563 | A1* | 6/2015 | Bang .................. H01L 27/3276 257/40 |
| 2016/0260792 | A1 | 9/2016 | Kim et al. |
| 2016/0284784 | A1* | 9/2016 | Lee ...................... H01L 27/3241 |
| 2016/0329391 | A1 | 11/2016 | Ko et al. |
| 2018/0076270 | A1* | 3/2018 | Kwon ................. H01L 27/3216 |

FOREIGN PATENT DOCUMENTS

| | | |
|---|---|---|
| KR | 10-0911993 | 8/2009 |
| KR | 10-2014-0017854 | 2/2014 |
| KR | 10-2016-0108669 | 9/2016 |
| KR | 10-2016-0130895 | 11/2016 |

OTHER PUBLICATIONS

Non-Final Office Action dated Mar. 5, 2019, in U.S. Appl. No. 15/801,287.

Final Office Action dated Jun. 21, 2019, in U.S. Appl. No. 15/801,287.

Notice of Allowance dated Sep. 11, 2019, in U.S. Appl. No. 15/801,287.

\* cited by examiner

FIG. 9

|  | R_45° | G_45° | B_45° | W_x | W_x' | Δx (W_x'− W_x) |
|---|---|---|---|---|---|---|
| COMPARATIVE EXAMPLE | 42.3% | 37.5% | 36.1% | 0.294 | 0.2929 | −0.0011 |
| EMBODIMENT | 44.9% | 41.2% | 37.5% | 0.297 | 0.297 | 0.000 |

ORGANIC LIGHT-EMITTING DISPLAY DEVICE

CROSS-REFERENCE TO RELATED APPLICATION

This application is a Continuation of U.S. patent application Ser. No. 15/801,287, filed Nov. 1, 2017, which claims priority to and the benefit of Korean Patent Application No. 10-2017-0063514, filed on May 23, 2017, each of which is hereby incorporated by reference for all purposes as if fully set forth herein.

BACKGROUND

Field

Exemplary embodiments relate to an organic light-emitting display device.

Discussion of the Background

Organic light-emitting display devices include two electrodes and an organic emission layer between the two electrodes. Electrons injected from a cathode, which is one of the two electrodes, and holes injected from an anode, which is the other electrode, combine in the organic emission layer to form excitons. The excitons emit light while emitting energy.

The organic light-emitting display devices include a plurality of pixels each including an organic light-emitting device (OLED) including a cathode, an anode, and an organic emission layer. Each pixel further includes a plurality of transistors for driving the OLED, and a capacitor. The plurality of transistors may include a switching transistor and a driving transistor. Such an organic light-emitting display device provides a fast response and is driven with low consumption power.

As resolution of organic light-emitting display devices increases, OLEDs, a plurality of transistors for driving the OLEDs, a capacitor, and lines for transmitting signals to the OLEDs, the transistors, and the capacitor need to be arranged such that they overlap each other. However, overlapping transistors and transistors that overlap the capacitor causes various issues such as poor brightness or a color shift phenomenon.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display device capable of reducing a lateral side color shift and securing good visibility while minimizing a difference between characteristics of pixels.

Additional aspects will be set forth in the detailed description which follows, and, in part, will be apparent from the disclosure, or may be learned by practice of the inventive concept.

According to exemplary embodiments, an organic light-emitting display device includes a plurality of pixels, each of which includes an organic light-emitting device including a pixel electrode, an organic emission layer, and an opposing electrode; a pixel defining layer covering an edge of the pixel electrode and being configured to define a light-emission region by having an opening which exposes a portion of the pixel electrode; and a reference line extending in a first direction and overlapping the pixel electrode with an insulating layer between the reference line and the pixel electrode. The reference line overlaps with a center point of the opening, and the opening is shifted to one side of the pixel electrode in a second direction perpendicular to the first direction.

According to exemplary embodiments, an organic light-emitting display device includes a plurality of pixels, the plurality of pixels including a plurality of first pixels, a plurality of second pixels, and a plurality of third pixels that emit different colors. Each of the plurality of first pixels includes a first organic light-emitting device including a first pixel electrode, a first organic emission layer, and a first opposing electrode; a first pixel defining layer covering an edge of the first pixel electrode and being configured to define a light-emission region by having a first opening which exposes a portion of the first pixel electrode; and a first reference line extending in a first direction and overlapping the first pixel electrode with an insulating layer between the first reference line and the first pixel electrode. The first reference line overlaps with a center point of the first opening, and the first opening is shifted to one side of the first pixel electrode in a second direction perpendicular to the first direction.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 9 is a table showing a luminance ratio for each color and color coordinates of white light in an embodiment of the present invention and those in a comparative example.

DETAILED DESCRIPTION OF THE ILLUSTRATED EMBODIMENTS

Figure 1:
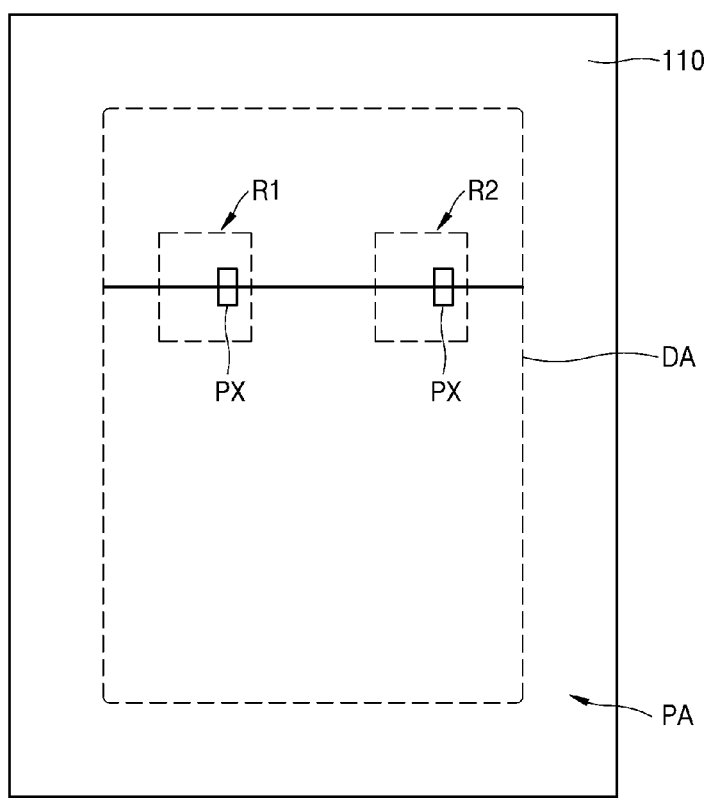
FIG. 1 is a schematic plan view of a portion of an organic light-emitting display device according to an exemplary embodiment.
Figure 1:
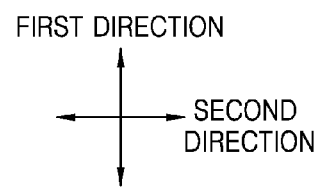

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Although an active matrix (AM) type organic light-emitting display device including seven thin film transistors (TFTs) and one capacitor in one pixel is illustrated in the accompanying drawings, embodiments of the present invention are not limited thereto. Accordingly, an organic light-emitting display device according to an embodiment may include a plurality of transistors and at least one capacitor in each pixel, and may be formed to have any of various structures in which special lines are further formed or existing lines are omitted. A pixel refers to the minimum unit in which an image is displayed, and an organic light-emitting display device displays an image by using a plurality of pixels.

An organic light-emitting display device according to an exemplary embodiment will now be described in detail with reference to the accompanying drawings.

FIG. 1 is a schematic plan view of a portion of an organic light-emitting display device according to an exemplary embodiment. As shown in FIG. 1, the organic light-emitting display device may include a substrate 110, which includes a display area DA on which an image is displayed and a peripheral area PA around the display area DA. On the display area DA of the substrate 110, a display unit that displays an image by using pixels PX each including an organic light-emitting device is arranged. On the peripheral area PA of the substrate 110, various lines and/or driving units for transmitting electrical signals to the display area DA may be positioned.

The display area DA includes a first pixel region R1 and a second pixel region R2 arranged at different locations. According to the present exemplary embodiment, respective pixels PX arranged on the first pixel region R1 and the second pixel region R2 may have the same structures or different structures. For example, arrangements between a light-emission region and a pixel electrode of a pixel PX, or lines thereof may differ according to the first pixel region R1 and the second pixel region R2.

Figure 2:
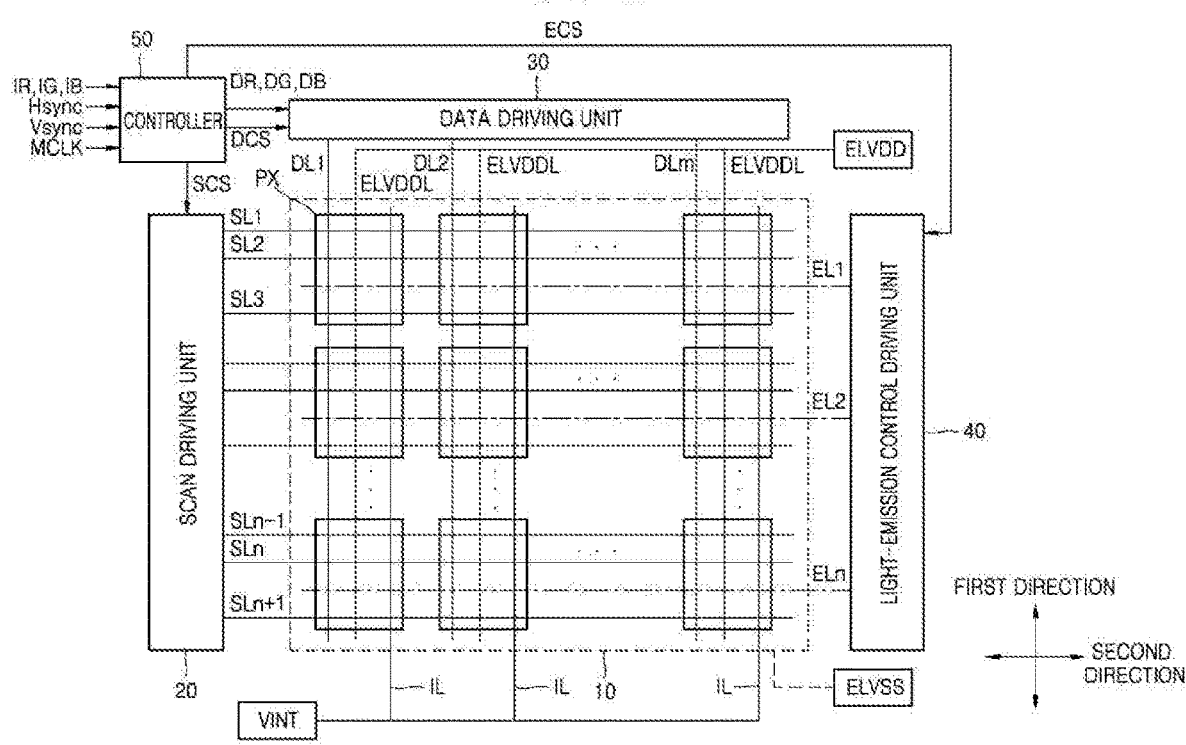
FIG. 2 is a block diagram of an organic light-emitting display device according to an exemplary embodiment.

FIG. 2 is a block diagram of an organic light-emitting display device according to an exemplary embodiment.

The organic light-emitting display device may include a display unit 10 including a plurality of pixels PX, a scan driving unit 20, a data driving unit 30, a light-emission control driving unit 40, and a controller 50.

The display unit 10 may be disposed on a display region, and may include a plurality of pixels PX at intersections of a plurality of scan lines SL1 through SLn+1, a plurality of data lines DL1 through DLm, and a plurality of light-emission control lines EL1 through ELn and arranged in an approximate matrix. The plurality of scan lines SL1 through SLn+1 and the plurality of light-emission control lines EL1 through ELn may each extend in a second direction, which is a row direction, and the plurality of data lines DL1 through DLm and a plurality of driving voltage lines ELVDDL each extend in a first direction, which is a column direction. In a pixel line, n values of the plurality of scan lines SL1 through SLn+1 may be different from those of the plurality of light-emission control lines EL1 through ELn.

Each pixel PX may be connected to three scan lines from among the plurality of scan lines SL1 through SLn+1 connected to the display unit 10. The scan driving unit 20 may generate three scan signals and transmits the same to each pixel PX via the plurality of scan lines SL1 through SLn+1. In other words, the scan driving unit 20 sequentially provides scan signals to first scan lines SL2 through SLn, second scan lines SL1 through SLn−1, or third scan lines SL3 through SLn+1.

Initializing voltage lines IL may receive an initializing voltage from an external power source VINT and may provide the initializing voltage to each pixel PX.

Each pixel PX may be connected to one of the plurality of data lines DL1 through DLm connected to the display unit 10 and one of the plurality of light-emission control lines EL1 through ELn connected to the display unit 10.

The data driving unit 30 may transmit a data signal to each pixel PX via the plurality of data lines DL1 through DLm. Every time a scan signal is provided to the first scan lines SL2 through SLn, the data signal may be provided to pixels PX selected by the scan signal.

The light-emission control driving unit 40 may generate a light-emission control signal and transmits the same to each pixel PX via the plurality of light-emission control lines EL1 through ELn. The light-emission control signal may control a light-emission time period of each pixel PX. The light-emission control driving unit 40 may be omitted according to internal structures of the pixels PX.

The controller 50 may change a plurality of externally-received image signals IR, IG, and IB to a plurality of image data signals DR, DG, and DB, and transmit the plurality of image data signals DR, DG, and DB to the data driving unit 30. The controller 50 may receive a vertical synchronization signal Vsync, a horizontal synchronization signal Hsync, and a clock signal MCLK, generate control signals for respectively controlling the scan driving unit 20, the data driving unit 30, and the light-emission control driving unit 40, and transmit the generated control signals to the scan driving unit 20, the data driving unit 30, and the light-emission control driving unit 40, respectively. In other words, the controller 50 may generate a scan driving control signal SCS for controlling the scan driving unit 20, a data driving control signal DCS for controlling the data driving unit 30, and an emission driving control signal ECS for controlling the light-emission control driving unit 40, and transmit the scan driving control signal SCS, the data driving control signal DCS, and the emission driving control signal ECS to the scan driving unit 20, the data driving unit 30, and the light-emission control driving unit 40, respectively.

Each of the plurality of pixels PX may receive a driving power supply voltage ELVDD and a common power supply voltage ELVSS from the outside. The driving power supply voltage ELVDD may be a predetermined high-level voltage, and the common power supply voltage ELVSS may be a voltage lower than the driving power supply voltage ELVDD or may be a ground voltage. The driving power supply voltage ELVDD may be provided to each pixel PX via a driving voltage line ELVDDL.

The plurality of pixels PX may emit light with a certain brightness according to driving currents that are provided to respective light-emitting devices of the plurality of pixels PX, according to the data signals received via the plurality of data lines DL1 through DLm.

Figure 3:
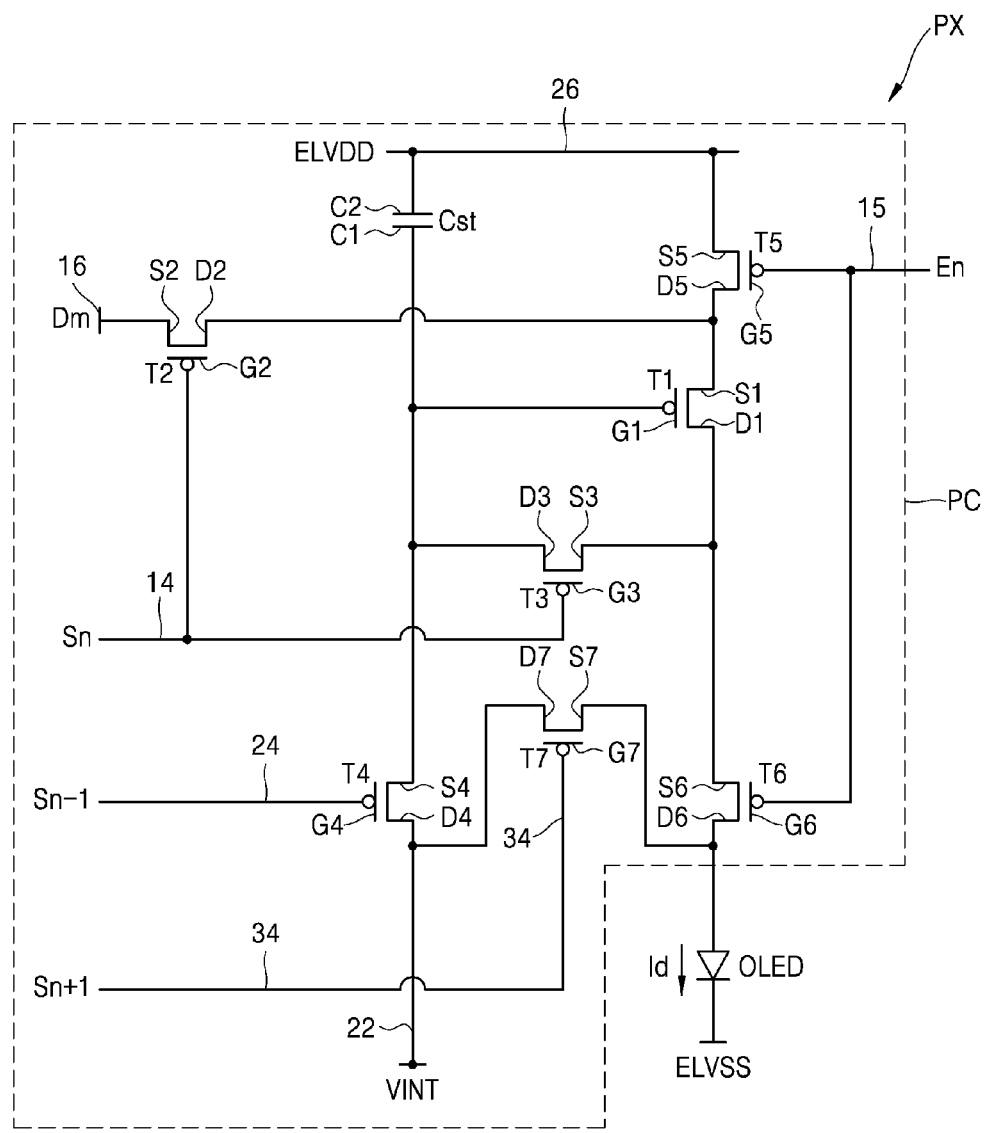
FIG. 3 is an equivalent circuit diagram of a pixel of an organic light-emitting display device according to an exemplary embodiment.

FIG. 3 is an equivalent circuit diagram of a pixel PX of an organic light-emitting display device according to an exemplary embodiment.

The pixel PX of the organic light-emitting display device according to an exemplary embodiment includes a pixel circuit PC including a plurality of thin film transistors T1 through T7 and at least one storage capacitor Cst. The pixel PX also includes an organic light-emitting device OLED that receives a driving current from the pixel circuit PC and emits light.

The plurality of thin film transistors T1 through T7 may include a driving thin film transistor T1, a switching thin film transistor T2, a compensating thin film transistor T3, a first initializing thin film transistor T4, a first light-emission control thin film transistor T5, a second light-emission control thin film transistor T6, and a second initializing thin film transistor T7.

The pixel PX may include a first scan line 14 for transmitting a first scan signal Sn to the switching thin film transistor T2 and the compensating thin film transistor T3, a second scan line 24 for transmitting a second scan signal Sn−1 to the first initializing thin film transistor T4, a third scan line 34 for transmitting a third scan signal Sn+1 to the second initializing thin film transistor T7, a light-emission control line 15 for transmitting a light-emission control signal En to the first light-emission control thin film transistor T5 and the second light-emission control thin film transistor T6, a data line 16 for transmitting a data signal Dm to the switching thin film transistor T2, a driving voltage line 26 for transmitting a driving power supply voltage ELVDD, and an initializing voltage line 22 for transmitting an initializing voltage VINT for initializing the driving thin film transistor T1.

A driving gate electrode G1 of the driving thin film transistor T1 may be connected to a first electrode C1 of the storage capacitor Cst. A driving source electrode S1 of the driving thin film transistor T1 may be connected to the driving voltage line 26 via the first light-emission control thin film transistor T5. A driving drain electrode D1 of the driving thin film transistor T1 may be electrically connected to an anode of the organic light-emitting device OLED via the second light-emission control thin film transistor T6. The driving thin film transistor T1 may receive the data signal Dm according to a switching operation of the switching thin film transistor T2 and supplies a driving current Id to the organic light-emitting device OLED.

A switching gate electrode G2 of the switching thin film transistor T2 may be connected to the first scan line 14. A switching source electrode S2 of the switching thin film transistor T2 may be connected to the data line 16. A switching drain electrode D2 of the switching thin film transistor T2 may be connected to the driving source electrode Si of the driving thin film transistor T1 and is also connected to the driving voltage line 26 via the first light-emission control thin film transistor T5. The switching thin film transistor T2 may be turned on according to the first scan signal Sn received via the first scan line 14 and perform a switching operation of transmitting the data signal Dm received from the data line 16 to the driving source electrode Si of the driving thin film transistor T1.

A compensating gate electrode G3 of the compensating thin film transistor T3 may be connected to the first scan line 14. A compensating source electrode S3 of the compensating thin film transistor T3 may be connected to the driving drain electrode D1 of the driving thin film transistor T1 and may also be connected to the anode of the organic light-emitting device OLED via the second light-emission control thin film transistor T6. A compensating drain electrode D3 of the compensating thin film transistor T3 may be connected to the first electrode C1 of the storage capacitor Cst, a first initializing source electrode S4 of the first initializing thin film transistor T4, and the driving gate electrode G1 of the driving thin film transistor T1. The compensating thin film transistor T3 may be turned on according to the first scan signal Sn received via the first scan line 14 and connects the driving gate electrode G1 of the driving thin film transistor T1 to the driving drain electrode D1 of the driving thin film transistor T1, such that the driving thin film transistor T1 is diode-connected.

A first initializing gate electrode G4 of the first initializing thin film transistor T4 may be connected to the second scan line 24. A first initializing drain electrode D4 of the first initializing thin film transistor T4 may be connected to the initializing voltage line 22. The first initializing source electrode S4 of the first initializing thin film transistor T4 may be connected to the first electrode C1 of the storage capacitor Cst, the compensating drain electrode D3 of the compensating thin film transistor T3, and the driving gate electrode G1 of the driving thin film transistor T1. The first initializing thin film transistor T4 may be turned on according to the second scan signal Sn−1 received via the second scan line 24 and transmits the initializing voltage VINT to the driving gate electrode G1 of the driving thin film transistor T1 to thereby initialize a voltage of the driving gate electrode G1 of the driving thin film transistor T1.

A first light-emission control gate electrode G5 of the first light-emission control thin film transistor T5 may be connected to the light-emission control line 15. A first light-emission control source electrode S5 of the first light-emission control thin film transistor T5 may be connected to the driving voltage line 26. A first light-emission control drain electrode D5 of the first light-emission control thin film transistor T5 may be connected to the driving source electrode S1 of the driving thin film transistor T1 and the switching drain electrode D2 of the switching thin film transistor T2.

A second light-emission control gate electrode G6 of the second light-emission control thin film transistor T6 may be connected to the light-emission control line 15. A second light-emission control source electrode S6 of the second light-emission control thin film transistor T6 may be connected to the driving drain electrode D1 of the driving thin film transistor T1 and the switching source electrode S3 of the switching thin film transistor T3. A second light-emission control drain electrode D6 of the second light-emission control thin film transistor T6 may be electrically connected to the anode of the organic light-emitting device OLED. The first light-emission control thin film transistor T5 and the second light-emission control thin film transistor T6 may be simultaneously turned on according to the light-emission control signal En received via the light-emission control line 15, and thus the first power supply voltage ELVDD may be transmitted to the organic light-emitting device OLED and thus the driving current Id may flow in the organic light-emitting device OLED.

A second initializing gate electrode G7 of the second initializing thin film transistor T7 may be connected to the third scan line 34. A second initializing source electrode S7 of the second initializing thin film transistor T7 may be connected to the anode of the organic light-emitting device OLED. A second initializing drain electrode D7 of the second initializing thin film transistor T7 may be connected to the initializing voltage line 22. The second initializing thin film transistor T7 may be turned on according to the third scan signal Sn+1 received via the third scan line 34 and initializes the anode of the organic light-emitting device OLED.

A second electrode C2 of the storage capacitor Cst may be connected to the driving voltage line 26. The first electrode C1 of the storage capacitor Cst may be connected to the driving gate electrode G1 of the driving thin film transistor T1, the compensating drain electrode D3 of the compensating thin film transistor T3, and the first initializing source electrode S4 of the first initializing thin film transistor T4.

A cathode of the organic light-emitting device OLED may be connected to the common power supply voltage ELVSS. The organic light-emitting device OLED receives the driving current Id from the driving thin film transistor T1 and emits light, thereby displaying an image.

According to an exemplary embodiment, a 7-transistor and 1-capacitor structure including the second initializing thin film transistor T7 is illustrated. However, exemplary embodiments of the present invention are not limited thereto, and the number of transistors and the number of capacitors may vary.

Figure 4:
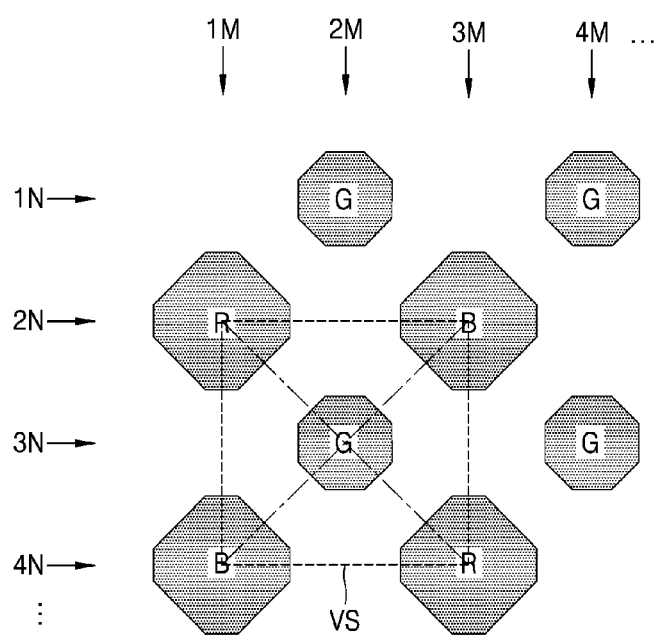
FIG. 4 is a schematic layout diagram of light-emission regions of a plurality of pixels of an organic light-emitting display device according to an exemplary embodiment.

FIG. 4 is a schematic layout diagram of light-emission regions of a plurality of pixels R, G, and B of an organic light-emitting display device according to an exemplary embodiment. The light-emission region of a pixel may be defined by an opening of a pixel defining layer. This will be described below.

As shown in FIG. 4, a plurality of green pixels G may be a predetermined distance apart from each other on a first row 1N, a plurality of red pixels R and a plurality of blue pixels B alternate with each other on a second row 2N adjacent to the first row 1N, a plurality of green pixels G are a predetermined distance apart from each other on a third row 3N adjacent to the second row 2N, a plurality of blue pixels B and a plurality of red pixels R alternate with each other on a fourth row 4N adjacent to the third row 3N, and this pixel layout may be repeated up to an N-th row. In this case, the blue pixels B and the red pixels R may be larger than the green pixels G.

The plurality of green pixels G on the first row 1N, and the plurality of red pixels R and the plurality of blue pixels B on the second row 2N may zigzag. Accordingly, red pixels R and blue pixels B may alternate with each other on a first column 1M, a plurality of green pixels G are a predetermined distance apart from each other on a second column 2M adjacent to the first column 1M, blue pixels B and red pixels R alternate with each other on a third column 3M adjacent to the second column 2M, a plurality of green pixels G are a predetermined distance apart from each other on a fourth column 4M adjacent to the third column 3M, and this pixel layout may be repeated up to an M-th column.

When describing this pixel layout differently, red pixels R may be arranged at first and third facing vertexes of the four vertexes of a virtual quadrilateral VS having a center point of a green pixel G as its center point, and blue pixels B are arranged at the remaining vertexes, namely, second and fourth vertexes. The virtual quadrilateral VS may be a rectangle, a rhombus, a square, or the like.

However, pixel layout structures according to exemplary embodiments are not limited thereto. For example, a blue pixel B instead of a green pixel G may be arranged on the center point of the virtual quadrilateral VS of FIG. 4, red pixels R may be arranged at the facing first and third vertexes of the four vertexes of the virtual quadrilateral VS, and green pixels G may be arranged at the remaining vertexes, namely, the facing second and fourth vertexes.

This pixel layout structure of FIG. 4 may be referred to as a PenTile matrix. By applying rendering, in which a color of a pixel may be expressed by sharing the colors of its adjacent pixels, to the PenTile matrix, high resolution may be obtained via a small number of pixels.

However, pixel layout structures according to exemplary embodiments are not limited to the PenTile matrix. For example, exemplary embodiments may be applied to pixel layout structures having a strip layout, a Mosaic layout, and a Delta layout. Exemplary embodiments may also be applicable to a pixel layout structure further including a white pixel that emits white light.

Figure 5:
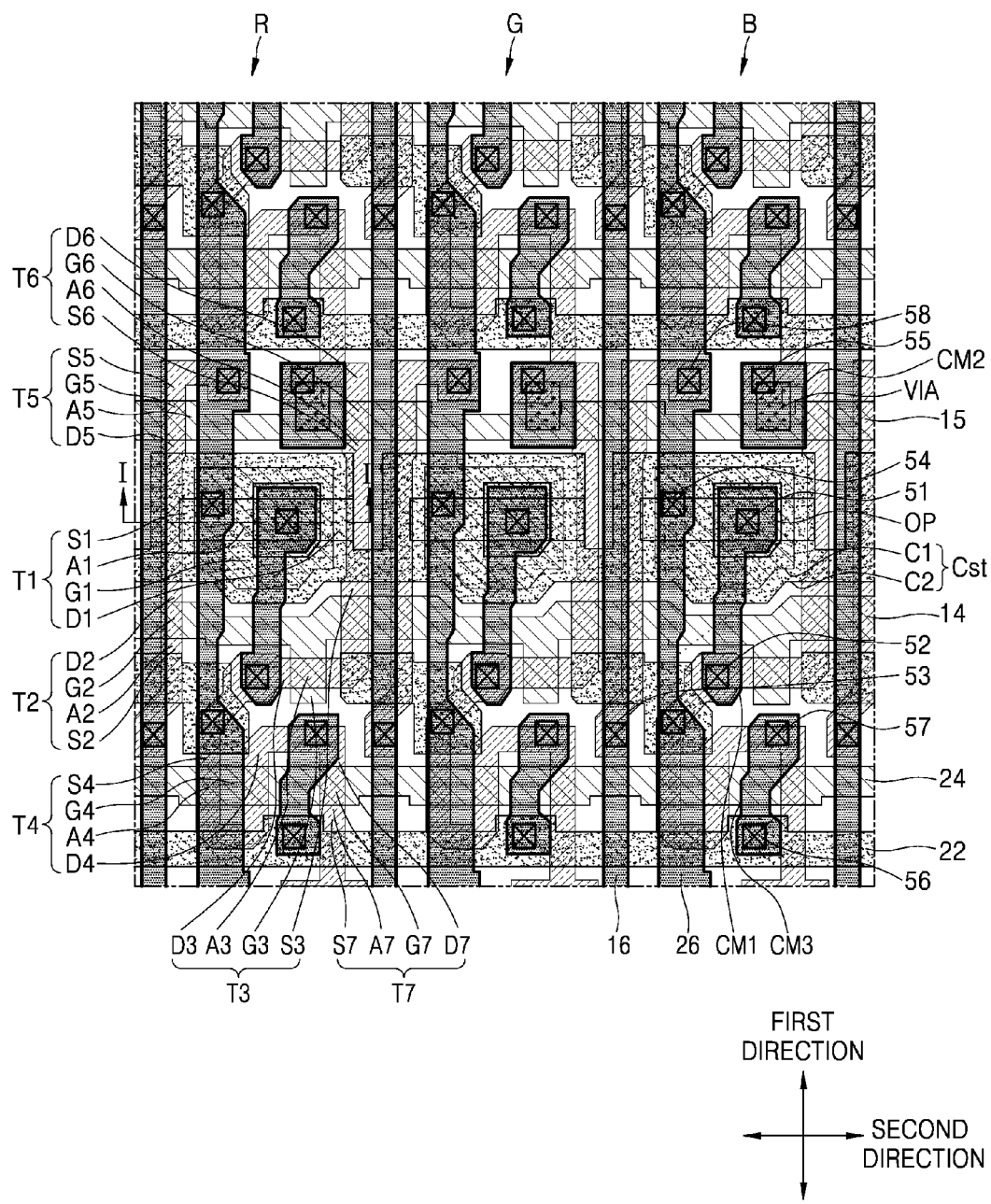
FIG. 5 is a layout diagram for schematically showing locations of a plurality of thin film transistors, a capacitor, etc. in a pixel of an organic light-emitting display device according to an exemplary embodiment.

FIG. 5 is a layout diagram for schematically showing locations of a plurality of thin film transistors, a capacitor, etc. in a pixel of an organic light-emitting display device according to an exemplary embodiment. In FIG. 5, organic light-emitting devices OLED are omitted. FIG. 5 illustrates three pixels R, G, and B adjacent to each other.

Referring to FIG. 5, each pixel may include the driving thin film transistor T1, the switching thin film transistor T2, the compensating thin film transistor T3, the first initializing thin film transistor T4, the first light-emission control thin film transistor T5, the second light-emission control thin film transistor T6, the second initializing thin film transistor T7, and the storage capacitor Cst.

The driving thin film transistor T1 may include a driving semiconductor layer A1, the driving gate electrode G1, the driving source electrode S1, and the driving drain electrode D1. The driving source electrode S1 corresponds to an impurity-doped driving source region in the driving semiconductor layer A1, and the driving drain electrode D1 corresponds to an impurity-doped driving drain region in the driving semiconductor layer A1. The driving gate electrode G1 may be connected to the first electrode C1 of the storage capacitor Cst, the compensating drain electrode D3 of the compensating thin film transistor T3, and the first initializing source electrode S4 of the first initializing thin film transistor T4. In more detail, the driving gate electrode G1 may be integrally formed with the first electrode C1 on the same layer. The driving gate electrode G1, the compensating drain electrode D3, and the first initializing source electrode S4 are connected to each other by a first contact line CM1. The first contact line CM1 may be connected to the driving gate electrode G1 via a first contact hole 51, and may be connected to a region between the compensating drain electrode D3 and the first initializing source electrode S4 via a second contact hole 52.

The switching thin film transistor T2 includes a switching semiconductor layer A2, the switching gate electrode G2, the switching source electrode S2, and the switching drain electrode D2. The switching source electrode S2 corresponds to an impurity-doped switching source region in the switching semiconductor layer A2, and the switching drain electrode D2 corresponds to an impurity-doped switching drain region in the switching semiconductor layer A2. The switching source electrode S2 may be connected to the data line 16 via a third contact hole 53. The switching drain electrode D2 may be connected to the driving thin film transistor T1 and the first light-emission control thin film transistor T5. The switching gate electrode G2 may be formed of a portion of the first scan line 14.

The compensating thin film transistor T3 may include a compensating semiconductor layer A3, the compensating gate electrode G3, the compensating source electrode S3, and the compensating drain electrode D3. The compensating source electrode S3 may correspond to an impurity-doped compensating source region in the compensating semiconductor layer A3, and the compensating drain electrode D3 corresponds to an impurity-doped compensating drain region in the compensating semiconductor layer A3. The compensating gate electrode G3 forms a dual gate electrode by a portion of the first scan line 14 and a portion of a line protruding from the first scan line 14, thereby preventing current leakage.

The first initializing thin film transistor T4 may include a first initializing semiconductor layer A4, the first initializing gate electrode G4, the first initializing source electrode S4, and the first initializing drain electrode D4. The first initializing source electrode S4 may correspond to an impurity-doped first initializing source region in the first initializing semiconductor layer A4, and the first initializing drain electrode D4 may correspond to an impurity-doped first initializing drain region in the first initializing semiconductor layer A4. The first initializing drain electrode D4 may be connected to the second initializing thin film transistor T7, and the first initializing source electrode S4 may be connected to the driving gate electrode G1 and the first electrode C1 of the storage capacitor Cst via the first contact line CM1 included in the second contact hole 52 and the first contact hole 51. The first initializing gate electrode G4 may be formed of a portion of the second scan line 24. The first initializing semiconductor layer A4 may form a dual gate electrode by being overlapped by the first initializing gate electrode G4 twice.

The first light-emission control thin film transistor T5 may include a first light-emission control semiconductor layer A5, the first light-emission control gate electrode G5, the first light-emission control source electrode S5, and the first light-emission control drain electrode D5. The first light-emission control source electrode S5 may correspond to an impurity-doped first light-emission control source region in the first light-emission control semiconductor layer A5, and the first light-emission control drain electrode D5 corresponds to an impurity-doped first light-emission control drain region in the first light-emission control semiconductor layer A5. The first light-emission control source electrode S5 may be connected to the driving voltage line 26 via a fourth contact hole 54. The first light-emission control gate electrode G5 may be formed of a portion of the light-emission control line 15.

The second light-emission control thin film transistor T6 may include a second light-emission control semiconductor layer A6, the second light-emission control gate electrode G6, the second light-emission control source electrode S6, and the second light-emission control drain electrode D6. The second light-emission control source electrode S6 may correspond to an impurity-doped second light-emission control source region in the second light-emission control semiconductor layer A6, and the second light-emission control drain electrode D6 corresponds to an impurity-doped second light-emission control drain region in the second light-emission control semiconductor layer A6. The second light-emission control drain electrode D6 may be connected to a pixel electrode of the organic light-emitting device OLED via a second contact line CM2 connected to a fifth contact hole 55 and a via hole VIA connected to the second contact line CM2. The second light-emission control gate electrode G6 may be formed of a portion of the light-emission control line 15.

The second initializing thin film transistor T7 may include a second initializing semiconductor layer A7, the second initializing gate electrode G7, the second initializing source electrode S7, and the second initializing drain electrode D7. The second initializing source electrode S7 may correspond to an impurity-doped second initializing source region in the second initializing semiconductor layer A7, and the second initializing drain electrode D7 corresponds to an impurity-doped second initializing drain region in the second initializing semiconductor layer A7. The second initializing drain electrode D7 may be connected to a third contact line CM3 connected to a seventh contact hole 57. The third contact line CM3 may be connected to the initializing voltage line 22 via a sixth contact hole 56. The second initializing gate electrode G7 may be formed of a portion of the second scan line 24. The second scan line 24 may serve as the third scan line 34.

The first electrode C1 of the storage capacitor Cst may be directly connected to the driving gate electrode G1, and may be connected to the first initializing thin film transistor T4 and the compensating thin film transistor T3 via the first contact line CM1 included in the first contact hole 51 and the second contact hole 52. The first electrode C1 may have a floating electrode shape and overlaps the driving semiconductor layer A1.

The second electrode C2 of the storage capacitor Cst may overlap the first electrode C1 but does not overlap the entire area of the first electrode C1. The second electrode C2 includes an opening portion OP via which a portion of the first electrode C1 may be exposed, and the first contact hole 51 may be formed within the opening portion OP. The second electrode C2 may be connected to the driving voltage line 26 via an eighth contact hole 58. Respective second electrodes C2 of adjacent pixels may be formed to be connected to each other.

The first scan line 14, the second scan line 24, and the light-emission control line 15 may all be formed on the same layer and each extend in the second direction. The first scan line 14, the second scan line 24, and the light-emission control line 15 may be formed on the same layer on which the first electrode C1 of the storage capacitor Cst may be formed.

The data line 16, the driving voltage line 26, the first contact line CM1, the second contact line CM2, and the third contact line CM3 may all be formed on the same layer and each extend in the first direction.

The second electrode C2 and the initializing voltage line 22 may both be formed on the same layer and each extend in the second direction. However, exemplary embodiments are not limited thereto. For example, the initializing voltage line 22 may be formed on the same layer on which the first scan line 14 or the data line 16 is formed.

Figure 6:
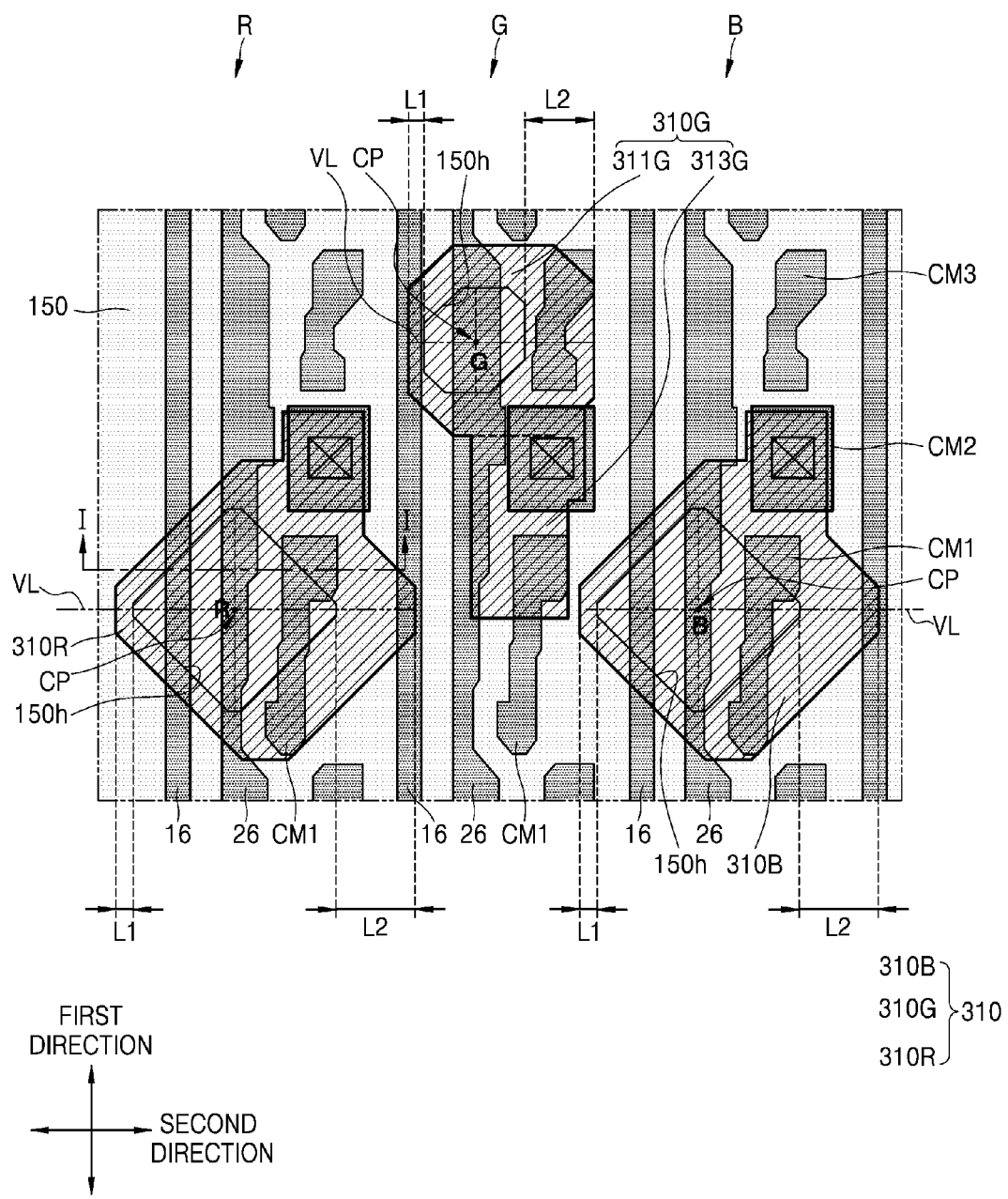
FIG. 6 is a schematic layout view for explaining a relationship between a pixel electrode of an organic light-emitting device, a light-emission region, and lines arranged to overlap with the light-emission region, in a pixel of an organic light-emitting display device according to an exemplary embodiment.
Figure 7:
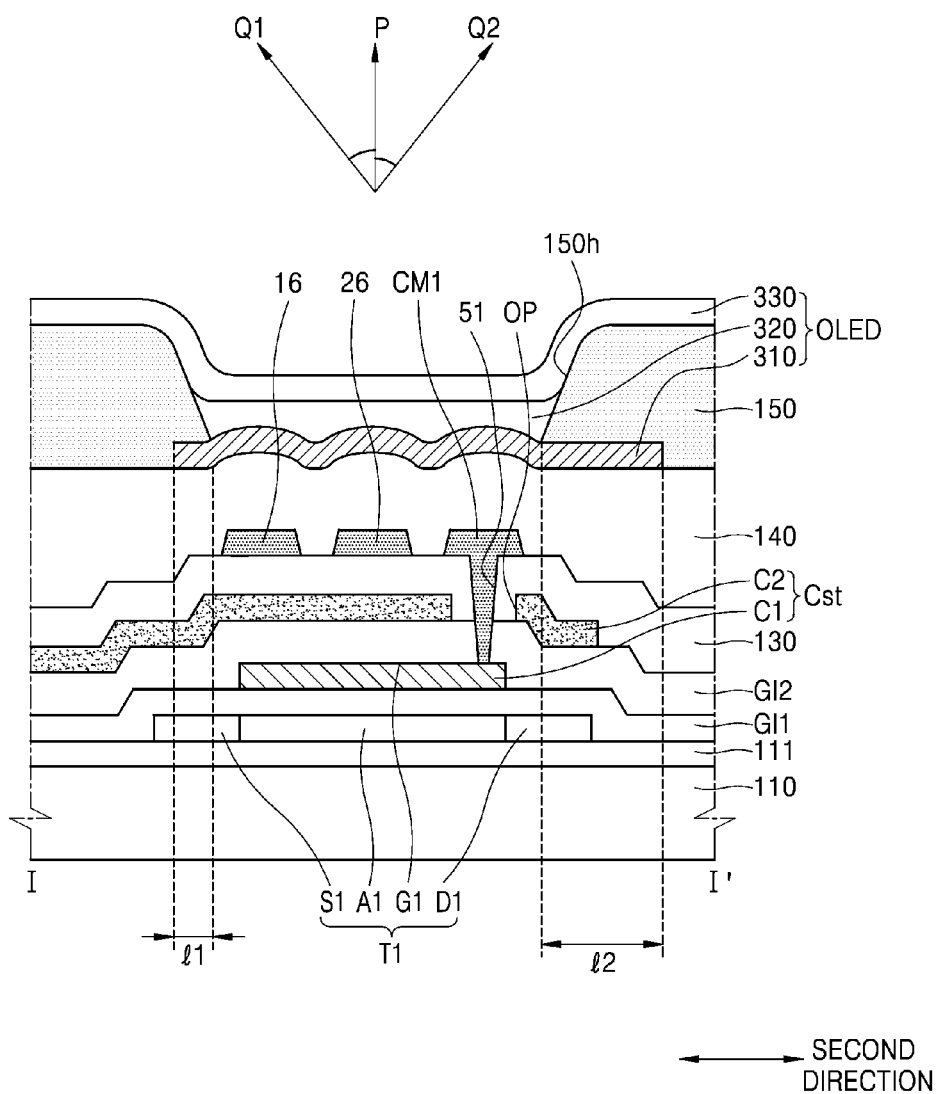
FIG. 7 is a cross-sectional view showing a cross-section taken along line I-I' of FIG. 5 and an organic light-emitting device arranged on the cross-section.

FIG. 6 is a schematic layout view for explaining a relationship between a pixel electrode 310 of an organic light-emitting device OLED, a opening 150*h* of a pixel defining layer 150 for defining a light-emission region, and lines arranged to overlap with the opening 150*h*, in a pixel of an organic light-emitting display device according to an exemplary embodiment. FIG. 7 is a cross-sectional view showing a cross-section taken along line I-I' of FIG. 5 and the organic light-emitting device OLED arranged on the cross-section.

Referring to FIGS. 6 and 7, the organic light-emitting display device according to an exemplary embodiment includes a plurality of pixels, each of which includes the organic light-emitting device OLED, the pixel defining layer 150 for defining the light-emission region by using the opening 150*h*, and the driving voltage line 26 corresponding to a reference line.

The plurality of pixels may include a plurality of red pixels R, a plurality of green pixels G, and a plurality of blue pixels B. FIG. 6 illustrates one red pixel R, one green pixel G, and one blue pixel B from among the plurality of pixels. As described above, the plurality of pixels may be arranged in a PenTile structure.

The organic light-emitting device OLED may include the pixel electrode 310, an intermediate layer 320 including an organic emission layer, and an opposing electrode 330, and the light-emission region of the organic light-emitting device OLED may be defined by the opening 150*h* of the pixel defining layer 150. One of the pixel electrode 310 and the opposing electrode 330 of the organic light-emitting device OLED may function as an anode, and the other may function as a cathode.

The pixel defining layer 150 may cover an edge of the pixel electrode 310 and include the opening 150*h* via which a portion of the pixel electrode 310 is exposed. Because the intermediate layer 320 including the organic emission layer may be arranged on the portion of the pixel electrode 310 exposed via the opening 150*h*, the opposing electrode 330 may be arranged on the intermediate layer 320, and light may be emitted from the intermediate layer 320 between the pixel electrode 310 and the opposing electrode 330. The light-emission region of the pixel may be defined by the opening 150*h*.

The driving voltage line 26, the data line 16, the first contact line CM1, and the third contact line CM3 may be arranged under the pixel electrode 310 with an insulating layer 140 therebetween. The lines may all be formed on the same layer and each extend in the first direction. According to the present exemplary embodiment, the lines are arranged on an interlayer insulating layer 130.

Herein, a line overlapped by a center point CP of the opening 150*h* of the pixel defining layer 150 and extending in the first direction, from among the lines may be referred to as a reference line. Given that a region of a lower layer exposed by the opening 150*h* may be a plane figure, the center point CP of the opening 150*h* may mean the center of mass of the plane figure. Alternatively, the center point may be defined as the intersection of a line forming the largest width in the first direction of the opening and a line forming the largest width in the second direction of the opening.

In FIGS. 6 and 7, the reference line may be the driving voltage line 26. However, exemplary embodiments are not limited thereto. For example, when the data line 16, the first contact line CM1, the third contact line CM3, or a line performing another function may be overlapped by the center point CP of the opening 150*h*, the data line 16, the first contact line CM1, the third contact line CM3, or the line performing the other function may be a reference line.

Although respective reference lines of the red pixel R, the green pixel G, and the blue pixel B are all the driving voltage lines 26 in FIG. 6, exemplary embodiments are not limited thereto. For example, the reference lines of the red pixel R and the blue pixel B may be the driving voltage line 26, and the reference line of the green pixel G may be the data line 16 or the third contact line CM3.

According to the present exemplary embodiment, an additional line other than the reference line may be arranged on the same layer on which the reference line may be arranged, within the opening 150*h*. The additional line may be spaced apart from the reference line and may extend in the first direction. In this case, the number of lines arranged on one side of the reference line may be the same as that of lines arranged on the other side of the reference line.

Within the opening 150*h* of the red pixel R, the data line 16 and the first contact line CM1 may be arranged as additional lines on both sides of the driving voltage line 26 being the reference line of the red pixel R, respectively. The number of lines arranged on one side of the driving voltage line 26 and that of lines arranged on the other side of the driving voltage line 26 may be the same, that is, '1'.

Within the opening 150*h* of the green pixel G, no additional lines may be arranged on both sides of the driving voltage line 26, which is the reference line of the green pixel G. It may be considered that the number of lines arranged on one side of the driving voltage line 26 passing the green pixel G and that of lines arranged on the other side of the driving voltage line 26 are the same, that is, '0'.

Within the opening 150*h* of the blue pixel B, the data line 16 and the first contact line CM1 may be arranged as additional lines on both sides of the driving voltage line 26 being the reference line of the blue pixel B, respectively. The number of lines arranged on one side of the driving voltage line 26 and that of lines arranged on the other side of the driving voltage line 26 may be the same, that is, '1'.

As such, when additional lines are arranged on both sides of the reference line, the additional lines may include a first additional line arranged on one side of the reference line and a second additional line arranged on the other side of the reference line, and a difference between a minimum distance between the first additional line and the reference line and that between the second additional line and the reference line may be less than 1 um. In other words, the first additional line and the second additional line may be arranged apart from each other by a symmetrical or similar distance about the reference line.

In FIG. 6, only the driving voltage line 26 may be arranged within the opening 150*h* of the green pixel G. However, exemplary embodiments are not limited thereto. For example, by enlarging the opening 150*h* of the green pixel G and the pixel electrode 310G, the data line 16 and the third contact line CM3 may be arranged as additional lines within the opening 150*h*. Alternatively, by shrinking the opening 150*h* of the red pixel R, only the driving voltage line 26 being the reference line may be arranged within the opening 150*h*. In this way, various modifications may be made.

According to the present exemplary embodiment, the driving voltage line 26, the data line 16, the first contact line CM1, and the third contact line CM3 corresponding to the reference line and the additional lines may be arranged as described above in order to minimize a lateral side color shift of the organic light-emitting display device and reduce asymmetrical white angular dependency (WAD).

In other words, referring to FIG. 7, when the organic light-emitting display device is viewed from the front (point P) and when the organic light-emitting display device is viewed from a side (point Q1 or Q2), a color coordinate representing the color of a pixel may have different values. When the organic light-emitting display device is viewed at a left-side 45° angle (point Q1) and when the organic light-emitting display device is viewed at a right-side 45° angle (point Q2), the color coordinate representing the color of a pixel may have different values. According to the present exemplary embodiment, the locations of lines arranged within the opening 150*h* may be controlled to minimize a variation in the value of a color coordinate according to angles at which the organic light-emitting display device is recognized, and to minimize a difference between the values of color coordinates when the organic light-emitting display device is viewed from the left side and when the organic light-emitting display device is viewed from the right side.

Because the driving voltage line 26, the data line 16, the first contact line CM1, and the third contact line CM3 corresponding to the reference line and the additional lines are arranged to overlap with the pixel electrode 310 with the insulating layer 140 therebetween, the insulating layer 140 and/or the pixel electrode 310 arranged over the lines may not be flat but may have steps due to the heights of the lines. In other words, due to the lines, irregularities may be vertically generated in the insulating layer 140 and/or the pixel electrode 310 arranged over the lines.

An influence of the steps of the lines or an influence according to locations of the lines may change optical characteristics of pixels. As shown in FIG. 7, steps or irregularities formed in the insulating layer 140 and/or the pixel electrode 310 may affect, for example, reflection or scattering of light and a change in the wavelength of light due to reflection of light. Accordingly, when the lines are arranged asymmetrically, color coordinate values obtained when the organic light-emitting display device is viewed at a left point (point Q1) and at a right point (point Q2) may have a bigger difference therebetween.

Accordingly, according to exemplary embodiments, the reference line may pass the center point CP of the opening 150*h* of the pixel defining layer 150, being the light-emission region, and the same number of additional lines may be arranged on the left and right sides of the reference line, whereby the light-emission region secures bilateral symmetry.

The pixel defining layer 150 may cover the edge of the pixel electrode 310 but may include the opening 150*h* via which a portion of the pixel electrode 310 may be exposed, thereby defining the light-emission region. The opening 150*h* may be formed to be shifted to one side of the pixel electrode 310 in the second direction perpendicular to the first direction.

In other words, the opening 150*h* may be formed such that a distance L1 between respective edge points of the pixel electrode 310 and the opening 150*h* that meet a virtual reference line VL, on the left side of the center point CP of the pixel defining layer 150, is different from a distance L2 between respective edge points of the pixel electrode 310 and the opening 150*h* that meet the virtual reference line VL, on the right side of the center point CP of the pixel defining layer 150. The virtual reference line VL may extend in the second direction while passing the center point CP of the opening 150*h*. In FIG. 6, the distance L2 may be greater than the distance L1. In other words, the distance L2 between the respective edge points of the pixel electrode 310 and the opening 150*h* on the right side of the center point CP of the pixel defining layer 150 may be greater than the distance L1 between the respective edge points of the pixel electrode 310 and the opening 150*h* on the left side of the center point CP of the pixel defining layer 150.

According to the present exemplary embodiment, the opening 150*h* of the pixel defining layer 150 may be formed to be shifted to one side of the pixel electrode 310, in order to secure uniform parasitic capacitance for each pixel to thereby minimize a color deviation or a difference in the other characteristics due to parasitic capacitance.

Referring to FIG. 7, the first electrode C1 and/or the second electrode C2 of the storage capacitor Cst, and the gate electrodes G1 through G7 are arranged under the pixel electrode 310. Accordingly, parasitic capacitance may be generated between the pixel electrode 310 and the first electrode C1 and/or the second electrode C2 of the storage capacitor Cst and the gate electrodes G1 through G7. If parasitic capacitance differs between pixels, characteristics of pixels due to parasitic capacitance may be different.

According to the present exemplary embodiment, in order for each pixel to have a uniform parasitic capacitance value, the pixel electrode 310 may not be shaped based on the opening 150*h* of the pixel defining layer 150 butshaped considering a first gate electrode or a second gate electrode under the opening 150*h*.

For example, referring to FIG. 6, the green pixel G includes a basic pixel electrode 311G and an extended pixel electrode 313G extending in the second direction in order to secure the same parasitic capacitance value as that of each of the red pixel R and the blue pixel B. Accordingly, if the location of the pixel electrode 310 moves in accordance with the location of the opening 150*h* of the pixel defining layer 150, the parasitic capacitance value may differ between pixels. Thus, the opening 150*h* of the pixel defining layer 150 may be formed to be shifted on one side of the pixel electrode 310.

A structure according to exemplary embodiments will now be described in more detail with reference to FIG. 7. FIG. 7 illustrates an organic light-emitting device OLED formed on the cross-section taken along line I-I' of FIG. 5. The line I-I' of FIG. 5 corresponds to the line I-I' of FIG. 6.

FIG. 7 illustrates the driving thin film transistor T1 from among the plurality of thin film transistors, and the storage capacitor Cst.

To clarify the feature of the present invention, FIG. 7 illustrates a pixel without components lowly relevant to representing the driving thin film transistor T1 and the storage capacitor Cst from among components, such as some lines, some electrodes, and some semiconductor layers arranged on a cross-section taken along a cutting line. Thus, the cross-section of FIG. 7 may be different from a cross-section actually taken along line I-I' of FIG. 5.

Referring to FIG. 7, a substrate 110 may be formed of any of various materials, for example, glass, metal, and plastic such as polyethylene terephthalate (PET), polyethylene naphthalate (PEN), or polyimide. The substrate 110 may have flexible or bendable characteristics. The substrate 110 may have a structure of a single layer or multiple layers of any of the aforementioned materials.

A buffer layer 111 may be formed on the substrate 110. The buffer layer 111 may increase smoothness of an upper surface of the substrate 110 or prevent or minimize infiltration of impurities from the substrate 110 and the like into the driving thin film transistor T1. The buffer layer 111 may include an inorganic material (such as oxide or nitride), an organic material, or an organic and inorganic compound, and may be formed as a single layer or multiple layers of an inorganic material and an organic material. According to some exemplary embodiments, the buffer layer 111 may have a three-layer structure of silicon oxide/silicon nitride/silicon oxide.

The driving semiconductor layer A1 of the driving thin film transistor T1 may be formed on the buffer layer 111. The driving semiconductor layer A1 may be formed of polysilicon and may include a channel region undoped with impurities and a source region and a drain region which are doped with impurities and are respectively formed on both sides of the channel region. The impurities may vary depending on the type of thin film transistor, and may be N-type impurities or P-type impurities. Although not shown, the switching semiconductor layer A2 of the switching thin film transistor T2, the compensating semiconductor layer A3 of the compensating thin film transistor T3, the first initializing semiconductor layer A4 of the first initializing thin film transistor T4, the second initializing semiconductor layer A7 of the second initializing thin film transistor T7, and the first light-emission control semiconductor layer A5 of the first light-emission control thin film transistor T5 may also be connected to the driving semiconductor layer A1 and the second light-emission control semiconductor layer A6 and may be formed simultaneously.

A first gate insulating layer GI1 may be stacked on the entire surface of the substrate 110 such that the first gate insulating layer GI1 covers the semiconductor layers A1 through A7. The first gate insulating layer GI1 may be formed of an inorganic material, such as silicon oxide or silicon nitride, and have a multi-layer structure or a single-layer structure. The first gate insulating layer GI1 insulates a semiconductor layer from gate electrodes. According to an exemplary embodiment, the first gate insulating layer GI1 may be thicker than a second gate insulating layer GI2 which may be to be described below. The first gate insulating layer GI1 may insulate respective semiconductor layers of the driving thin film transistor T1, the switching thin film transistor T2, the compensating thin film transistor T3, the first initializing thin film transistor T4, the first light-emission control thin film transistor T5, the second light-emission control thin film transistor T6, and the second initializing thin film transistor T7, from the gate electrodes G1 through G7 of the thin film transistors T1 through T7, respectively. When the first gate insulating layer GI1 is thick, the parasitic capacitance between a semiconductor layer and a gate electrode may decrease, and thus staining of an image displayed on the organic light-emitting display device may be reduced. In the case of the driving thin film transistor T1, the parasitic capacitance between the driving semiconductor layer A1 and the driving gate electrode G1 may decrease, and a gate voltage Vgs applied to the driving gate electrode G1 has a wide driving range. Accordingly, light emitted from the organic light-emitting device may be controlled to have a more extensive gray scale, by varying the magnitude of the gate voltage Vgs applied to the driving gate electrode G1 of the driving thin film transistor T1.

The driving gate electrode G1 of the driving thin film transistor T1 and the first electrode C1 of the storage capacitor Cst may be formed on the first gate insulating layer GI1.

Although not shown, the switching gate electrode G2 of the switching thin film transistor T2, the compensating gate electrode G3 of the compensating thin film transistor T3, the first initializing gate electrode G4 of the first initializing thin film transistor T4, the second initializing gate electrode G7 of the second initializing thin film transistor T7, and the first light-emission control gate electrode G5 of the first light-emission control thin film transistor T5 may be simultaneously formed with the second light-emission control gate electrode G6, the driving gate electrode G1, and the first electrode C1. The driving gate electrode G1, the switching gate electrode G2, the compensating gate electrode G3, the first initializing gate electrode G4, the second initializing gate electrode G7, the first light-emission control gate electrode G5, the second light-emission control gate electrode G6, and the first electrode C1 may be formed of a same material as the first gate line GL1, and are hereinafter referred to as first gate electrodes.

The switching gate electrode G2, the compensating gate electrode G3, the first initializing gate electrode G4, the second initializing gate electrode G7, the first light-emission control gate electrode G5, and the second light-emission control gate electrode G6 may be defined as regions where the first scan line 14, the second scan line 24, and the light-emission control line 15 overlap with the semiconductor layer. Accordingly, a process of forming the switching gate electrode G2, the compensating gate electrode G3, the first initializing gate electrode G4, the second initializing gate electrode G7, the first light-emission control gate electrode G5, and the second light-emission control gate electrode G6 may correspond to a process of forming the first scan line 14, the second scan line 24, and the light-emission control line 15. The driving gate electrode G1 may be integrally formed with the first electrode C1. The first gate line GL1 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu).

According to an exemplary embodiment, the storage capacitor Cst overlaps with the driving thin film transistor T1. In detail, because the driving gate electrode G1 and the first electrode C1 are integrally formed with each other, the storage capacitor Cst and the driving thin film transistor T1 inevitably overlap each other. Because the storage capacitor Cst may be arranged to overlap with the driving thin film transistor T1, the storage capacitor Cst may have a sufficient storage capacity.

The second gate insulating layer GI2 may be stacked on the entire surface of the substrate 110 such that the second gate insulating layer GI2 covers the first gate electrodes. The second gate insulating layer GI2 may be formed of an inorganic material, such as silicon oxide or silicon nitride, and have a multi-layer structure or a single-layer structure. The second gate insulating layer GI2 insulates the first gate electrodes from second gate electrodes. The second gate insulating layer GI2 serves as a dielectric layer of the storage capacitor Cst. To increase the storage capacity of the storage capacitor Cst, the second gate insulating layer GI2 may be thinner than the first gate insulating layer GI1.

The second electrode C2 of the storage capacitor Cst may be formed on the second gate insulating layer GI2. The second electrode C2 may be arranged to overlap the first electrode C1. However, the second electrode C2 has an opening OP via which a portion of the first electrode C1 may be exposed. The first electrode C1 may be connected to the compensating thin film transistor T3 and the first initializing thin film transistor T4 via the first contact hole 51 formed within the opening OP. The second electrode C2 may be formed of a material of the second gate line GL2, and may be hereinafter referred to as a second gate electrode. Similar to the first gate line GL1, the second gate line GL2 may include at least one metal selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu). The second electrode C2 of one pixel may be directly connected to the second electrode C2 of its adjacent pixel.

An interlayer insulating layer 130 may be formed on the entire surface of the substrate 110 such that the interlayer insulating layer 130 covers the second electrode C2 of the storage capacitor Cst. The interlayer insulating layer 130 may be formed of an inorganic insulating material, such as silicon oxide, silicon nitride, and/or silicon oxynitride.

An insulating layer including an inorganic material, such as the buffer layer 111, the first gate insulating layer GI1, the second gate insulating layer GI2, and the interlayer insulating layer 130, may be formed by chemical vapor deposition (CVD) or atomic layer deposition (ALD). This may be equally applied to exemplary embodiments to be described below and modifications thereof.

The driving voltage line 26, the data line 16, the first contact line CM1, and the like are formed on the interlayer insulating layer 130, and the insulating layer 140 may be formed on the entire surface of the substrate 110 to cover the data line 16, the driving voltage line 26, the first contact line CM1, and the like.

The insulating layer 140 may be formed of an organic insulating material, such as, acryl, benzocyclobutene (BCB) or hexamethyldisiloxane (HMDSO). The insulating layer 140 may be formed of an inorganic insulating material, such as silicon oxide, silicon nitride, and/or silicon oxynitride. The insulating layer 140 may be formed as a single layer or a multi-layer.

The organic light-emitting device OLED may be disposed on the insulating layer 140, and includes the pixel electrode 310, the opposing electrode 330, and the intermediate layer 320 between the pixel electrode 310 and the opposing electrode 330 and including an organic emission layer. The pixel electrode 310 may be connected to the second contact line CM2 of FIG. 5 via the via hole VIA of FIG. 5 formed in the insulating layer 140. The second contact line CM2 may be connected to the second light-emission control drain electrode D6 and the second initializing source electrode S7 via the sixth contact hole 56 of FIG. 5.

The pixel defining layer 150 may be disposed on the insulating layer 140. The pixel defining layer 150 defines light-emission regions of pixels by including respective openings 150*h* corresponding to the pixels, namely, openings 150*h* via each of which at least a portion of the pixel electrode 310 may be exposed. In a case as illustrated in FIG. 7, the pixel defining layer 150 prevents an arc from occurring on the edge of the pixel electrode 310 by increasing a distance between the edge of the pixel electrode 310 and the opposing electrode 330 arranged over the pixel electrode 310. The pixel defining layer 150 may be formed of an organic material, for example, polyimide or HMDSO.

The intermediate layer 320 of the organic light-emitting device OLED may include a low molecular weight material or a high molecular weight material. When the intermediate layer 320 includes a low-molecular weight material, the intermediate layer 320 may have a structure in which a hole injection layer (HIL), a hole transport layer (HTL), an organic emission layer (EML), an electron transport layer (ETL), an electron injection layer (EIL) are stacked in a single or complex structure, and may include various organic materials including copper phthalocyanine (CuPc), N,N'-Di(naphthalene-1-yl)-N,N'-diphenyl-benzidine (NB), and tris-8-hydroxyquinoline aluminum (Alq3). These layers may be formed by vacuum deposition.

When the intermediate layer 320 includes a high-molecular weight material, the intermediate layer 320 may generally include an HTL and an EML. In this case, the HTL may include poly(ethylenedioxythiophene) (PEDOT), and the EML may include a high-molecular weight material such as a polyphenylene vinylene (PPV)-based material or a polyfluorene-based material. The intermediate layer 320 may be formed by screen printing, inkjet printing, laser induced thermal imaging (LITI), or the like.

The intermediate layer 320 is not limited to the structure described above, and may have any of various other structures. The intermediate layer 320 may include a single layer that covers a plurality of pixel electrodes 310 or may include patterned layers respectively corresponding to the plurality of pixel electrodes 310.

The opposing electrode 330 may be formed as a single body constituting a plurality of organic light-emitting devices OLED, and thus may correspond to the plurality of pixel electrodes 310.

When the pixel electrode 310 functions as an electrode, the pixel electrode 310 may include a material having a high work function, such as ITO, IZO, ZnO, or In2O3. When the organic light-emitting display device is of a top-emission type, the pixel electrode 310 may further include a reflection layer including silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca). These materials may be independently used, or may be combined with each other and used. The pixel electrode 310 may have a single-layer or multi-layer structure including the aforementioned metals and/or alloys thereof. In some exemplary embodiments, the pixel electrode 310 may be a reflective electrode and thus may have an ITO/Ag/ITO structure.

When the opposing electrode 330 functions as a cathode electrode, the opposing electrode 330 may be formed of a metal, such as silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca). When the organic light-emitting display device is of a top-emission type, the opposing electrode 330 needs to be able to transmit light. According to some exemplary embodiments, the opposing electrode 330 may include transparent conductive metal oxide, such as ITO, IZO, ZnO, or In2O3.

According to another exemplary embodiment, the opposing electrode 330 may include a thin film including at least one of Li, Ca, LiF/Ca, LiF/Al, Al, Ag, Mg, or Yb. For example, the opposing electrode 330 may have a single-layer or stacked-layer structure of Mg:Ag, Ag:Yb, and/or Ag.

As shown in FIGS. 6 and 7, various lines under the pixel electrode 310 overlap each other, and thus the insulating layer 140 and/or the pixel electrode 310 arranged over the various lines may form a step and not be flat. In other words, due to the lines, irregularities may be vertically generated on the insulating layer 140 and/or the pixel electrode 310 arranged over the lines.

According to exemplary embodiments, in order to minimize an influence of the steps of the lines or an influence according to locations of the lines, the reference line passes the center point CP of the opening 150*h* of the pixel defining layer 150, being the light-emission region, and additional lines are arranged on left and right sides of the reference line, whereby the light-emission region secures bilateral symmetry.

According to exemplary embodiments, the opening 150*h* of the pixel defining layer 150 may be shifted to one side of the pixel electrode 310 to form an inequality of 11<12, so that a parasitic capacitance that may be generated between the pixel electrode 310 and the first and/or second gate electrodes may be secured uniformly for pixels.

Figure 8:
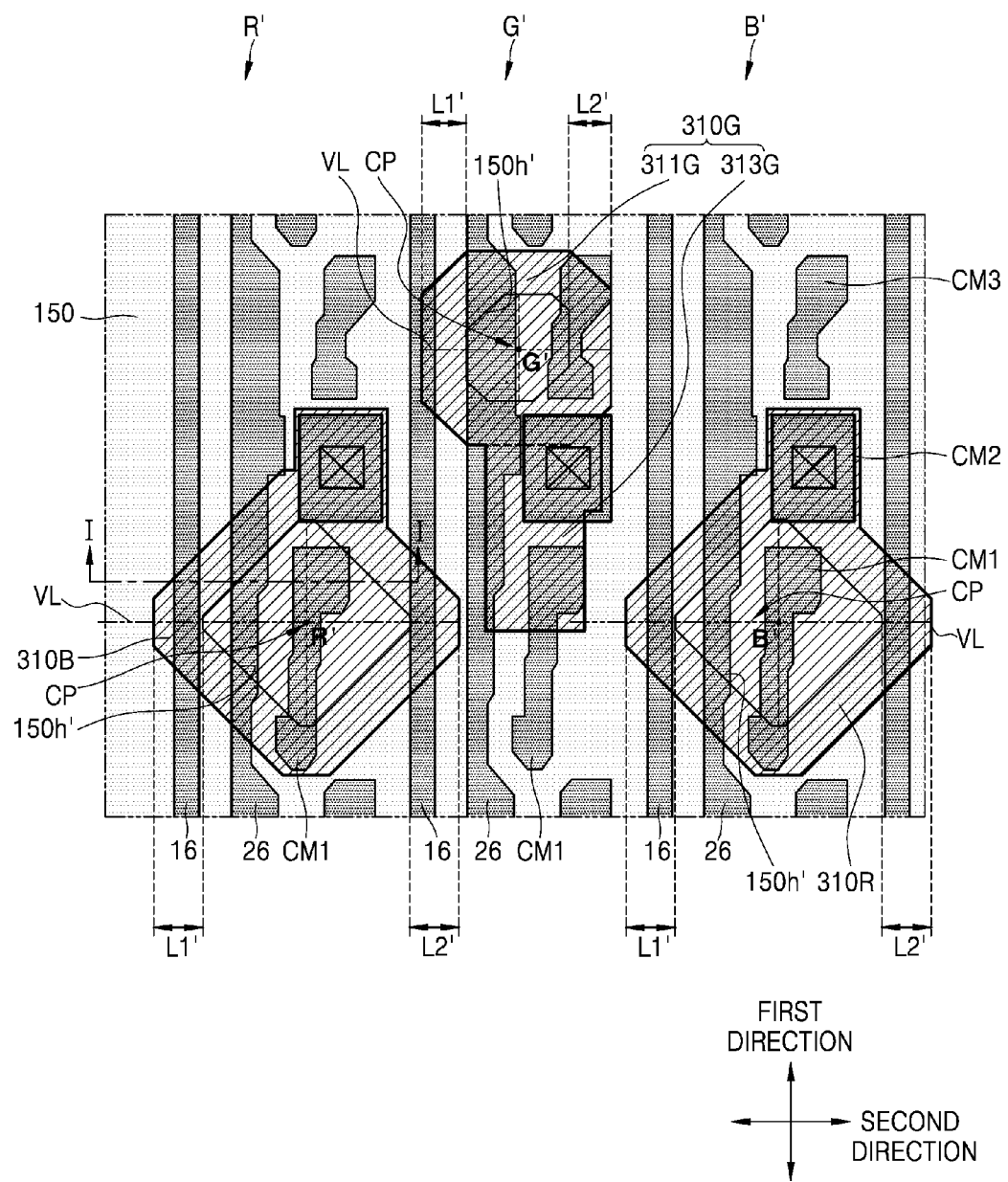
FIG. 8 is a schematic plan view of a comparative example to be compared with an exemplary embodiment.

FIG. 8 is a schematic plan view of a comparative example to be compared with an exemplary embodiment.

Referring to FIG. 8, first contact lines CM1, which are reference lines, pass center points CP of holes of a red pixel R' and a blue pixel B', but the number of additional lines arranged on one side of each first contact line CM1, which may be the reference line, may be not the same as that of additional lines arranged on the other side of each first contact line CM1.

In the case of the red pixel R', one additional line, namely, the driving voltage line 26, may be arranged on the left side of the first contact line CM1 being the reference line, and no additional lines are arranged on the right side of first contact line CM1 being the reference line.

In the case of the blue pixel B', one additional line, namely, the driving voltage line 26, may be arranged on the left side of the first contact line CM1 being the reference line, and no additional lines may be arranged on the right side of the first contact line CM1 being the reference line.

In the case of the green pixel G', no reference lines may be arranged on the center point CP of the hole.

The opening 150*h*' of each of the pixels R', G', and B' may be not shifted to one side of the pixel electrode 310 in the second direction. In other words, a distance L1' between respective edge points of the pixel electrode 310 and the opening 150*h*' that meet a virtual reference line VL, on the left side of the center point CP of the pixel defining layer 150, may be substantially the same as a distance L2' between respective edge points of the pixel electrode 310 and the opening 150*h*' that meet the virtual reference line VL, on the right side of the center point CP of the pixel defining layer 150. The virtual reference line VL extends in the second direction while passing the center point CP of the opening 150*h*'. In other words, it may be illustrated that the distance L2' between the respective edge points of the pixel electrode 310 and the opening 150h' on the right side of the center point CP of the pixel defining layer 150 may be equal to the distance L1' between the respective edge points of the pixel electrode 310 and the opening 150h' on the left side of the center point CP of the pixel defining layer 150 (L1'=L2').

FIG. 9 is a table showing a luminance ratio for each color and color coordinates of white light in an exemplary embodiment and those in a comparative example.

In FIGS. 9, R_45°, G_45°, and B_45° respectively indicate luminance ratios of red, green, and blue colors measured on a 45° lateral side relative to the front side. In other words, given that brightness measured on the front side may be 100%, R_45°, G_45°, and B_45° refer to luminance ratios for red, green, and blue colors, respectively. According to an exemplary embodiment, the luminance ratios for red, green, and blue colors measured on the 45° lateral side are respectively 44.9%, 41.2%, and 37.5%, which are all greater than those according to the comparative example.

In FIG. 9, W_x and W_x' indicate x values of a CIE 1931 color coordinate system. W_x refers to an x coordinate of white light measured on the front side, and W_x' refers to an x coordinate of white light measured on a 45° lateral side. Being that a change in an x coordinate means having an influence on a red color. Δx refers to a change between color coordinate values on the front side and on the lateral side, which is W_x'-Wx.

In the comparative example, the x value of the color coordinate differs between the front side and the lateral side. However, according to an exemplary embodiment, the value of the color coordinate did not change. In other words, according to an exemplary embodiment, brightness on the lateral side of each pixel may be improved, and a color shift phenomenon may be reduced.

Figure 10:
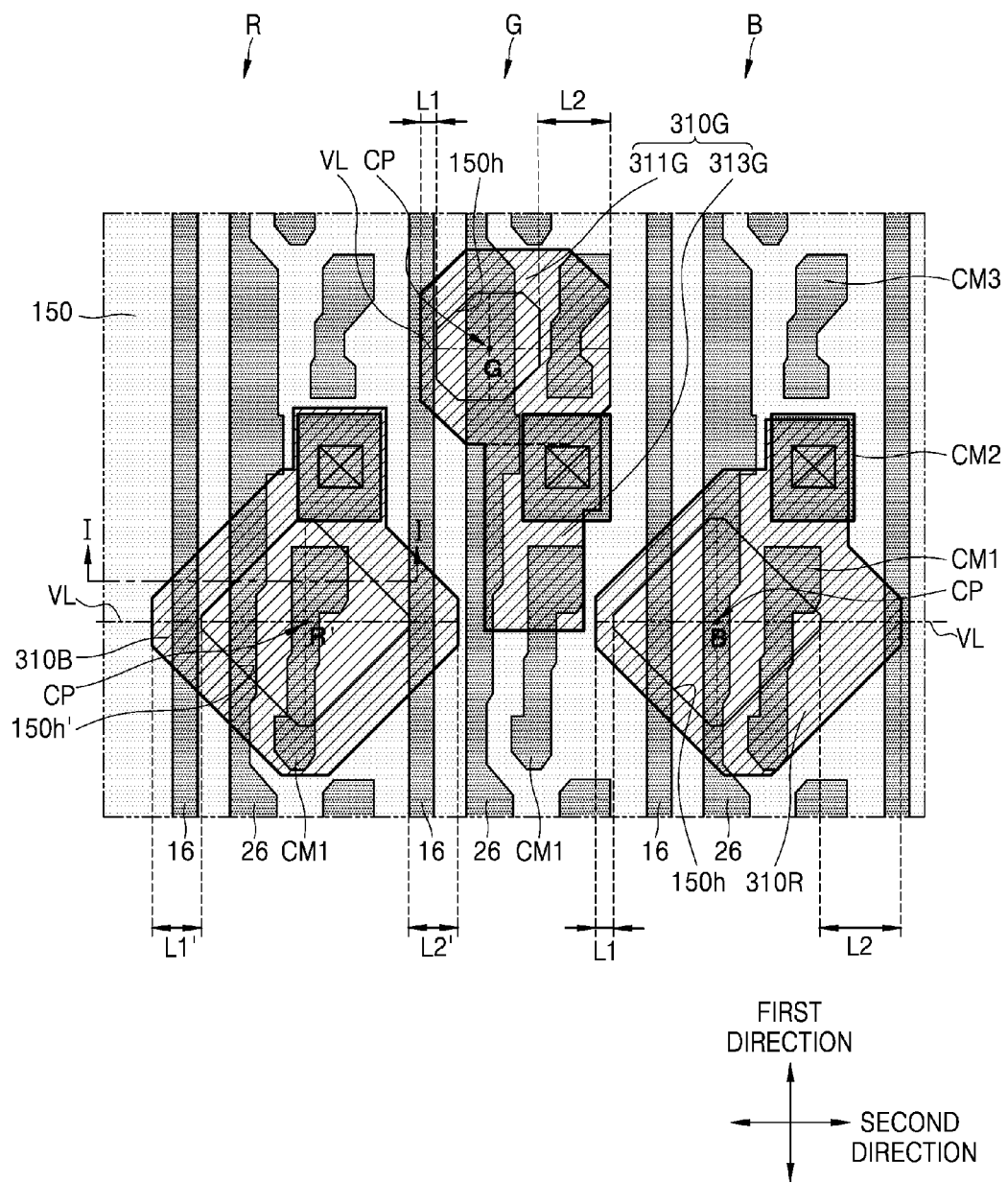
FIG. 10 is a schematic layout view for explaining a relationship between a pixel electrode of an organic light-emitting device, a light-emission region, and lines arranged to overlap with the light-emission region, in a pixel of an organic light-emitting display device according to another exemplary embodiment.

FIG. 10 is a schematic layout view for explaining a relationship between the pixel electrode 310 of the organic light-emitting device OLED, the opening 150h of the pixel defining layer 150 for defining a light-emission region, and the lines arranged to overlap with the opening 150h, in a pixel of an organic light-emitting display device according to another exemplary embodiment.

Referring to FIG. 10, the organic light-emitting display device according to another exemplary embodiment includes a plurality of pixels, each of which includes the organic light-emitting device OLED, the pixel defining layer 150 for defining the light-emission region by using the opening 150h, and the driving voltage line 26 corresponding to a reference line. The plurality of pixels may include a plurality of red pixels R, a plurality of green pixels G, and a plurality of blue pixels B.

In the organic light-emitting display device according to another exemplary embodiment, only some of the red pixel R, the green pixel G, and the blue pixel B include reference lines arranged to overlap with the center point CP of the opening 150h, and the number of additional lines arranged on one side of each reference line may be the same as that of additional lines arranged on the other side of the reference line. The additional lines mean lines arranged to overlap with the opening 150h.

Referring to FIG. 10, in the case of the green pixel G and the blue pixel B, a reference line may be arranged to overlap with the center point CP of the opening 150h, and the number of additional lines arranged on one side of the reference line may be the same as that of additional lines arranged on the other side of the reference line.

In other words, it may be considered that the number of lines arranged on one side of the driving voltage line 26 passing the green pixel G and that of lines arranged on the other side of the driving voltage line 26 are the same, that is, '0'.

Within the opening 150h of the blue pixel B, the data line 16 and the first contact line CM1 are arranged as additional lines on both sides of the driving voltage line 26 being the reference line of the blue pixel B, respectively. The number of lines arranged on one side of the driving voltage line 26 and that of lines arranged on the other side of the driving voltage line 26 are the same, that is, '1'.

As such, when additional lines are arranged on both sides of the reference line, the additional lines may include a first additional line arranged on one side of the reference line and a second additional line arranged on the other side of the reference line, and a difference between a minimum distance between the first additional line and the reference line and that between the second additional line and the reference line may be less than 1 um . In other words, the first additional line and the second additional line may be arranged apart from each other by a symmetrical or similar distance about the reference line.

In the case of the red pixel R, one additional line, namely, the driving voltage line 26, may be arranged on the left side of the first contact line CM1 being the reference line, and no additional lines may be arranged on the right side of the first contact line CM1 being the reference line.

The opening 150h of each of the green and blue pixels G and B may be formed to be shifted to one side of the pixel electrode 310 in the second direction perpendicular to the first direction. On the other hand, the opening 150h of the red pixel R may not be shifted to one side of the pixel electrode 310 in the second direction.

In other words, in the case of the green pixel G and the blue pixel B, the opening 150h may be formed such that a distance L1 between respective edge points of the pixel electrode 310 and the opening 150h that meet a virtual reference line VL, on the left side of the center point CP of the opening 150h, is different from a distance L2 between respective edge points of the pixel electrode 310 and the opening 150h that meet the virtual reference line VL, on the right side of the center point CP of the opening 150h. The virtual reference line VL may extend in the second direction while passing the center point CP of the opening 150h. In FIG. 10, the distance L2 may be greater than the distance L1. In other words, the distance L2 between the respective edge points of the pixel electrode 310 and the opening 150h on the right side of the center point CP of the opening 150h may be greater than the distance L1 between the respective edge points of the pixel electrode 310 and the opening 150h on the left side of the center point CP of the opening 150h.

In the case of the red pixel R, the opening 150h may be formed such that a distance L1 between respective edge points of the pixel electrode 310 and the opening 150h that meet a virtual reference line VL, on the left side of the center point CP of the opening 150h, may be substantially the same as a distance L2 between respective edge points of the pixel electrode 310 and the opening 150h that meet the virtual reference line VL, on the right side of the center point CP of the opening 150h. The virtual reference line VL may extend in the second direction while passing the center point CP of the pixel defining layer 150.

According to the present exemplary embodiment, the red pixel R has the same structure as the red pixel R' in the comparative example of FIG. 8, and the green pixel G and the blue pixel B have the same structures as those according to the exemplary embodiment of FIG. 6. This may be a structure for minimizing a difference between luminance ratios of red, green, and blue pixels on the 45° lateral side relative to the front side, based on the data of FIG. 9.

Figure 11A:
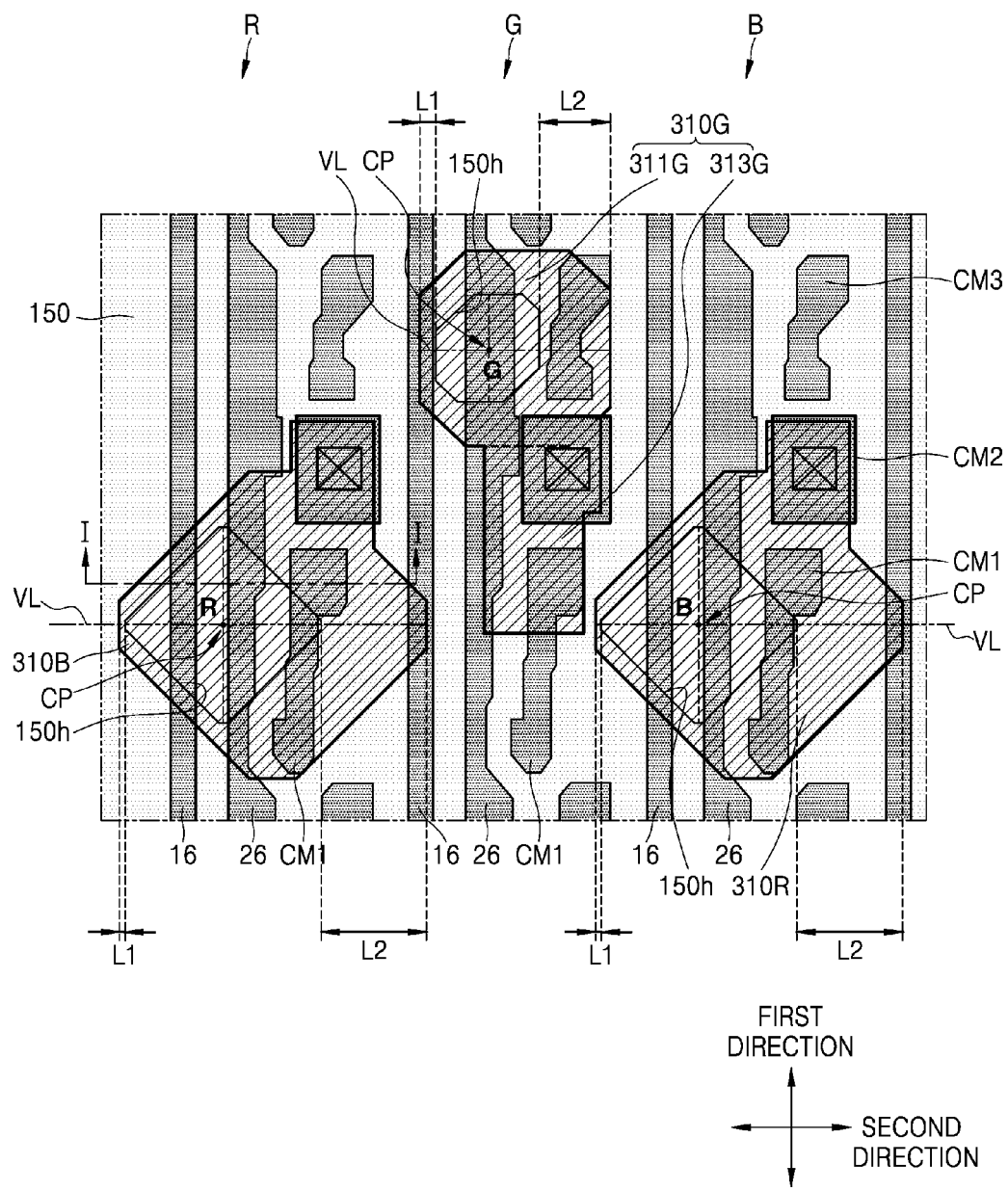
FIG. 11A and FIG. 11B are schematic layout views for explaining a relationship between a pixel electrode of an organic light-emitting device, a light-emission region, and lines arranged to overlap with the light-emission region, in a pixel of an organic light-emitting display device according to another exemplary embodiment.
Figure 11B:
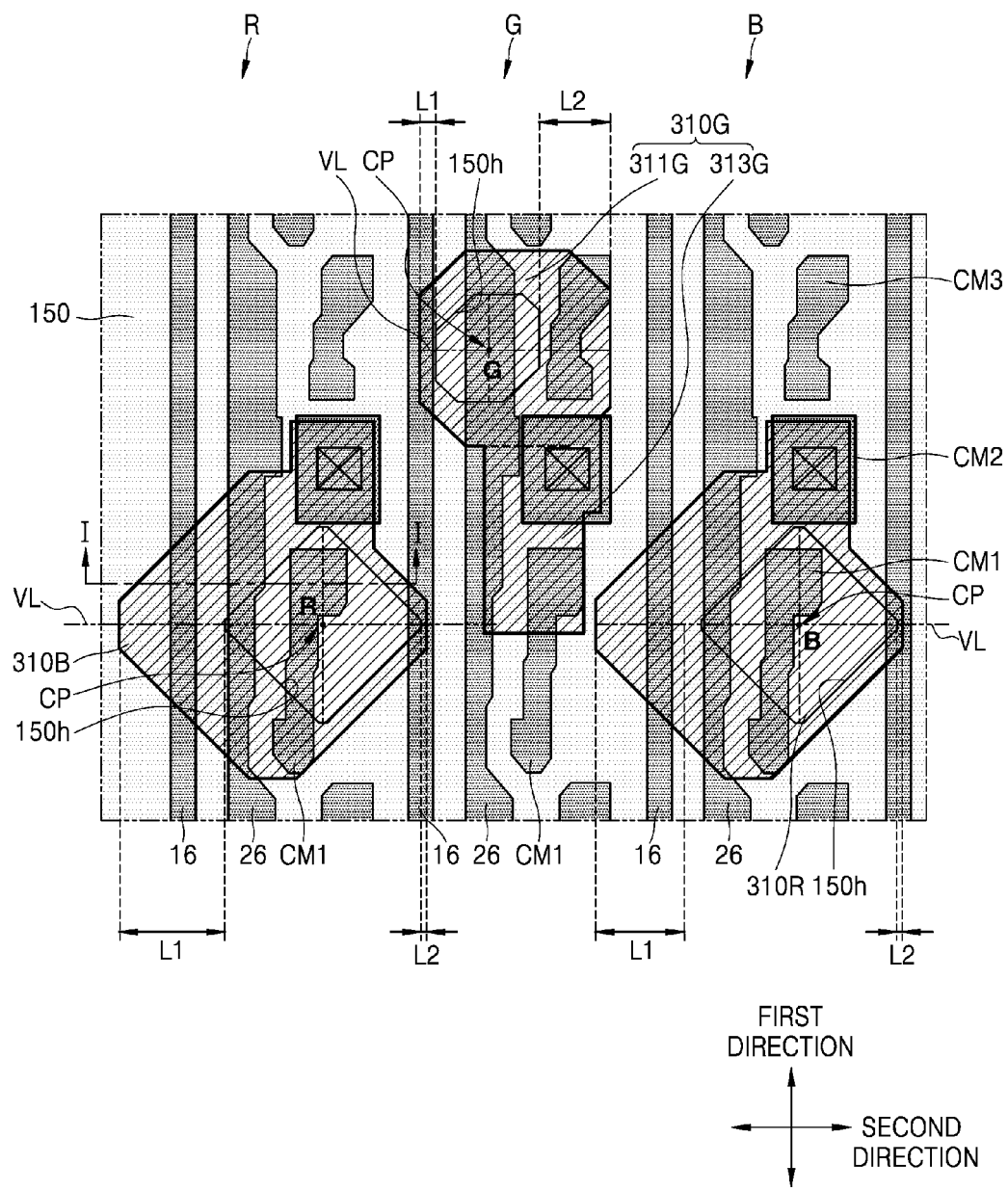

FIGS. 11A and 11B are schematic layout views of some pixels included in the first pixel region R1 of FIG. 1 and some pixels included in the second pixel region R2 of FIG. 1 in an organic light-emitting display device according to another exemplary embodiment, wherein the first and second pixel regions R1 and R2 are arranged at different locations.

Referring to FIGS. 11A and 11B, in the case of green pixels G in the first pixel region R1 and the second pixel region R2, a reference line may be arranged within the opening 150h to overlap with the center point CP of the opening 150h, and the number of lines arranged on one side of the reference line may be the same as that of lines arranged on the other side of the reference line. In the first pixel region R1 and the second pixel region R2, the opening 150h of each of the green pixels G may be formed to be shifted to one side of the pixel electrode 310 in the second direction perpendicular to the first direction. Such a structure of the green pixel G may be reflected in not only the first pixel region R1 and the second pixel region R2 but also the entire display region of the organic light-emitting display device.

However, a red pixel R and a blue pixel B in the first pixel region R1 may have different structures from those in the second pixel region R2. According to some exemplary embodiments, the first pixel region R1 and the second pixel region R2 may be aligned on a straight line extending in the second direction, the first pixel region R1 may be on the left side of the display region of the organic light-emitting display device, and the second pixel region R2 may be on the right side of the display region of the organic light-emitting display device.

In the first pixel region R1, the opening 150h of the red pixel R may be shifted to the left side of a pixel electrode 310R. In the first pixel region R1, the opening 150h of the blue pixel B may be shifted to the left side of a pixel electrode 310B. (L1<L2).

In the second pixel region R2, the opening 150h of the red pixel R may be shifted to the right side of the pixel electrode 310R. In the second pixel region R2, the opening 150h of the blue pixel B may be shifted to the right side of a pixel electrode 310B. (L1>L2).

According to the present exemplary embodiment, the degree to which the opening 150h of the red pixel R and the opening 150h of the blue pixel B are shifted to the left or right side of the pixel electrode 310 may vary according to locations of the display region. For example, in a direction from the left side of a pixel region toward the right side thereof in the second direction, the value of the distance L1 may gradually increase.

However, exemplary embodiments are not limited thereto. For example, the opening 150h of the red pixel R in the first pixel region R1 may be shifted to the right side of the pixel electrode 310R, and the opening 150h of the red pixel R in the second pixel region R2 may be shifted to the left side of the pixel electrode 310R. In this way, various modifications may be made.

According to the present exemplary embodiment, in the case of the green pixels G, a line layout within the opening 150h may maintain uniformity regardless of locations of the pixel region, and, in the case of the red pixels R and the blue pixels B, a line layout within the opening 150h may be controlled according to locations of the pixel region. Due to this control, a difference between right-side WAD and left-side WAD of the organic light-emitting display device may be minimized.

According to various exemplary embodiments, uniform characteristics between pixels may be maintained, and also a lateral side color shift of an organic light-emitting display device may be minimized and uniformity between right-side WAD and left-side WAD of the organic light-emitting display device may be obtained.

Of course, the scope of the present invention may be not limited thereto.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light-emitting display device comprising:
   a plurality of pixels, at least one of the plurality of pixels comprising an organic light-emitting device comprising a pixel electrode, an organic emission layer, and an opposing electrode;
   a pixel defining layer covering the pixel electrode defining a light-emission region by having an opening which exposes a portion of the pixel electrode; and
   a via hole overlapping the pixel electrode, wherein:
   a first distance between a first boundary of the pixel electrode and a first virtual line (VL) is different from a second distance between a second boundary of the pixel electrode and the first VL;
   the first VL extends in a first direction and passes through a center point of the opening;
   the first boundary and the second boundary are arranged on opposite sides of the first virtual line;
   the plurality of pixels comprise a red pixel, a green pixel, and a blue pixel;
   the via hole of the red pixel, the via hole of the green pixel, and the via hole of the blue pixel are arranged on a second VL, the second VL extending in a second direction perpendicular to the first direction in a plan view; and
   the plurality of pixels are arranged in a pentile matrix pixel array.

2. The organic light-emitting display device of claim 1, wherein:
   each of the plurality of pixels further comprises a driving thin film transistor arranged on a substrate and comprising a driving gate electrode; and
   at least a portion of the pixel electrode overlaps with the driving gate electrode.

3. The organic light-emitting display device of claim 2, wherein:
   each of the plurality of pixels further comprises a storage capacitor overlapping with the driving thin film transistor and comprising a first electrode and a second electrode; and
   the first electrode is integrally formed with the driving gate electrode.

4. The organic light-emitting display device of claim 3, wherein:
   the driving thin film transistor comprises a driving semiconductor layer arranged under the driving gate electrode and insulated from the driving gate electrode by a first gate insulating layer; and a second gate insulating layer is arranged between the first electrode and the second electrode.

5. The organic light-emitting display device of claim 1, further comprising a reference line extending in a first direction and overlapping the pixel electrode with an insulating layer disposed between the reference line and the pixel electrode, wherein the reference line overlaps with a center point of the opening.

6. The organic light-emitting display device of claim 5, wherein the reference line is a driving voltage line configured to transmit a driving voltage to each pixel.

7. An organic light-emitting display device comprising:
a plurality of pixels, at least one of the plurality of pixels comprising an organic light-emitting device comprising a pixel electrode, an organic emission layer, and an opposing electrode;
a pixel defining layer covering the pixel electrode and being configured to define a light-emission region by having an opening which exposes a portion of the pixel electrode; and
a via hole overlapping the pixel electrode, wherein:
the pixel electrode includes a 1st region, a 2nd region, a 3rd region, and a 4th region divided by a first virtual line (VL) and a horizontal VL;
the first VL extends in a first direction and passes through a center point of the opening;
the horizontal VL perpendicular to the first VL and passes through the center point of the opening;
the via hole is entirely disposed in the 1st region; and
at least one of the 2nd region, the 3rd region, and the 4th region has a different size.

8. The organic light-emitting display device of claim 7, wherein:
the horizontal VL is disposed between the 2nd region and 3rd region; and
the 2nd region and 3rd region are symmetric with respect to the horizontal VL.

9. The organic light-emitting display device of claim 7, wherein:
the first VL is disposed between the 1st region and the 2nd region;
the horizontal VL is disposed between the 2nd region and the 3rd region; and
a size of the 2nd region is different from a size of the 4th region.

* * * * *